United States Patent [19]

Hosoda et al.

[11] Patent Number: 5,728,504
[45] Date of Patent: Mar. 17, 1998

[54] POSITIVE PHOTORESIST COMPOSITIONS AND MULTILAYER RESIST MATERIALS USING THE SAME

[75] Inventors: Hiroshi Hosoda; Satoshi Niikura; Atsushi Sawano; Tatsuya Hashiguchi; Kazuyuki Nitta; Hidekatsu Kohara; Toshimasa Nakayama, all of Kanagawa-ken, Japan

[73] Assignee: Tokyo Ohka Kogyo Co., Ltd., Kanagawa-ken, Japan

[21] Appl. No.: 652,389

[22] Filed: May 23, 1996

[30] Foreign Application Priority Data

May 25, 1995 [JP] Japan .................................. 7-151021
Apr. 26, 1996 [JP] Japan .................................. 8-130773

[51] Int. Cl.$^6$ ........................................ G03F 7/023
[52] U.S. Cl. ................ 430/192; 430/165; 430/190; 430/191; 430/193
[58] Field of Search ........................... 430/165, 192, 430/193, 190, 191

[56] References Cited

U.S. PATENT DOCUMENTS

| | | | |
|---|---|---|---|
| 4,732,836 | 3/1988 | Potvin et al. | 430/192 |
| 4,732,837 | 3/1988 | Potvin et al. | 430/192 |
| 4,910,122 | 3/1990 | Arnold et al. | 430/313 |
| 5,035,976 | 7/1991 | Potvin et al. | 430/165 |
| 5,162,510 | 11/1992 | Potvin et al. | 534/557 |
| 5,401,605 | 3/1995 | Doi et al. | 430/192 |
| 5,429,905 | 7/1995 | Tan et al. | 430/192 |
| 5,501,936 | 3/1996 | Hosoda et al. | 430/192 |

FOREIGN PATENT DOCUMENTS

| | | |
|---|---|---|
| 2-186 351 | 7/1990 | Japan . |
| 4-301 848 | 10/1992 | Japan . |
| 4-301 849 | 10/1992 | Japan . |
| 4-301 850 | 10/1992 | Japan . |
| 4-301 851 | 10/1992 | Japan . |

*Primary Examiner*—John S. Chu
*Attorney, Agent, or Firm*—Wenderoth, Lind & Ponack

[57] ABSTRACT

A positive photoresist composition comprising (A) an alkali-soluble resin and (B) a light-sensitive component comprising at least one compound represented by the following general formula (I):

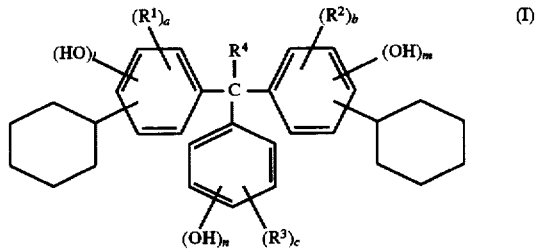

where $R^1$, $R^2$ and $R^3$ are each independently a hydrogen atom, an alkyl group having 1–3 carbon atoms or an alkoxy group having 1–3 carbon atoms; $R^4$ is a hydrogen atom or an alkyl group having 1–3 carbon atoms; a, b and c are an integer of 1–3; l, m and n are an integer of 1–3, in which at least part of the hydroxyl groups present are esterified with a quinonediazidosulfonic acid and a sulfonic acid which has a group represented by the following formula (II):

$$-SO_2-R^5 \qquad (II)$$

where $R^5$ is a substituted or unsubstituted alkyl group, an alkenyl group or a substituted or unsubstituted aryl group, thereby forming a mixed ester, and a multilayer resist material in which a positive photoresist layer formed of said positive photoresist composition is provided on an anti-reflective coating over a substrate are capable of forming high-resolution resist patterns with good cross-sectional profiles and permit a wider margin of exposure and better depth-of-focus characteristics.

12 Claims, No Drawings

POSITIVE PHOTORESIST COMPOSITIONS AND MULTILAYER RESIST MATERIALS USING THE SAME

BACKGROUND OF THE INVENTION

1. Field of the Invention

This invention relates to positive photoresist compositions sensitive to radiations, as well as multilayer resist materials using the same. More particularly, the invention relates to positive photoresist compositions that are capable of forming high-resolution resist patterns with good cross-sectional profiles and assure a wider margin of exposure and better depth-of-focus characteristics. The invention also relates to multilayer resist materials using such improved positive photoresist compositions.

2. Description of Related Art

In the conventional process of fabricating semiconductor devices such as ICs and LSIs and liquid-crystal devices such as LCDs, positive photoresist compositions comprising the combination of film-forming alkali-soluble resins and the light-sensitive component made of quinonediazido group containing compounds are known to be suitable and have been used commercially. Novolacs are useful as film-forming alkali-soluble resins since they are not only soluble in aqueous alkali solutions without swelling, thus assuring good development characteristics, but also highly resistant to heat when used as masks in plasma etching. The quinonediazido group containing compounds as the light-sensitive component are noteworthy in two aspects: they are inherently capable of suppressing the alkali solubility of the novolac resins; on the other hand, if these compounds are irradiated with electromagnetic waves such as ultraviolet light (g- and i-lines) and deep ultraviolet light including excimer lasers, as well as particle rays such as electron beams in the lithographic process, they become alkali-soluble to acquire the ability to enhance the alkali solubility of the novolacs. Thus, the quinonediazido group containing compounds undergo substantial changes in properties upon exposure to radiations and many positive photoresist compositions containing such compounds in combination with alkali-soluble novolac resins have been developed and some of them are already in the stage of commercial production (see, for example, U.S. Pat. No. 4,377,631, Unexamined Published Japanese Patent Application Nos. 35349/1987, 142548/1989, 179147/1989 and Examined Japanese Patent Publication No. 4897/1991).

As the degree of integration in semiconductor devices is ever increasing today, it is required to process fineline patterns with submicron (<1 µm) precisions in the manufacture of VLSIs and this has presented the need for further improvements in the characteristics of positive photoresist compositions including the resolution and the geometry of resist patterns. Under the circumstances, attempts were made to improve the characteristics of positive photoresist compositions by using as the light-sensitive component the "mixed esters" of polyhydroxybenzophenone comprising both quinonediazidesulfonic acid esters and alkylsulfonic acid esters (e.g. methanesulfonic acid esters) or carboxylic acid esters (e.g. acetic acid esters); for specific examples of the proposal, see Unexamined Published Japanese Patent Application Nos. 284353/1987, 24244/1988 and 186351/1990. Photoresists using such mixed esters are suitable for use in lithography with g-line (436 nm) but the resolution is insufficient in lithography with i-line (365 nm). Another problem is that the solubility in resist solvents is low enough to produce unwanted precipitation of the light-sensitive component.

To avoid these problems, Unexamined Published Japanese Patent Application Nos. 301848/1992, 301849/1992, 301850/1992, 301851/1992, etc. have proposed positive photoresists using as the light-sensitive component those nonbenzophenonic phenolic compounds having 3–5 benzene rings which are in the form of mixed esters comprising quinonediazidosulfonic acid esters and alkylsulfonic acid esters or carboxylic acid esters.

Compared to the positive photoresists using the polyhydroxybenzophenone in the form of mixed esters comprising quinonediazidosulfonic acid esters and alkylsulfonic acid esters or carboxylic acid esters, the photoresists using the new light-sensitive component are sufficiently improved in the resolution and the margin of exposure to be suitable for lithography with i-line. However, even such photoresists are not completely satisfactory in terms of the resolution, the margin of exposure and the depth-of-focus characteristics if they are to be used in the fabrication of VLSIs which presently require resolutions less than half a micron meter (e.g. 0.4 µm or 0.35 µm). Thus, the heretofore proposed positive photoresist compositions are not ideal for use in the fabrication of most modern VLSIs which require resolutions of 0.4 µm or 0.35 µm and further improvements are necessary in terms of the geometry of resist patterns, the resolution, the margin of exposure and the depth-of-focus characteristics.

In the lithographic process, substrates having high-reflection films such as aluminum and tungsten silicide films or substrates having steps are typically employed; however, due to the influences of standing waves or the random reflection from the substrates, various problems occur such as the waviness of the geometry of resist patterns and the local distortion of resist patterns which is generally referred to as "notching".

With a view to solving the above-mentioned problems, a multilayer resist process, generally referred to as a BARC (bottom anti-reflective coating) method and characterized by the provision of an anti-reflective coating between the substrate and the resist layer, has been proposed (see Unexamined Published Japanese Patent Application No. 93448/1984). This process is not only effective in eliminating the adverse effects of standing waves and preventing the random reflection from the substrate; it can also achieve marked improvements in resist characteristics such as the resolution and the depth of focus compared to the conventional monolayer resist process. Hence, the BARC method is suitable for producing fineline resist patterns having feature sizes of 0.35 µm and below.

However, the positive photoresists conventionally employed in the BARC method have not been fully satisfactory in terms of pattern geometry since the resist patterns obtained have either a flared feature or an undersized top. Thus, it is desired to make available multilayer resist materials for use in the practice of the BARC method that use those positive photoresist compositions which are free from the aforementioned problems and satisfactory in such characteristics as the geometry of resist patterns, the resolution, the margin of exposure and the depth of focus.

The present inventors conducted intensive studies in order to meet this requirement and found that it could be satisfied by combining alkali-soluble resins with phenolic compounds having a specified chemical structure in which at least part of the hydroxyl groups present were esterified with quinonediazidosulfonic acid and a specified sulfonic acid to provide an "mixed ester". The present invention has been accomplished on the basis of this finding.

SUMMARY OF THE INVENTION

An object of the invention is to provide positive photoresist compositions that are capable of forming high-resolution resist patterns with good cross-sectional profiles in the fabrication of VLSIs requiring resolutions of half a micron and less and which permit a wider margin of exposure and better depth-of-focus characteristics.

Another object of the invention is to provide multilayer resist materials that use positive photoresist compositions suitable for implementation of the BARC method which involves the formation of an anti-reflective coating on the substrate.

Thus, in one aspect, the invention relates to a positive photoresist composition comprising:

(A) an alkali-soluble resin; and (B) a light-sensitive component comprising at least one phenolic compound represented by the following general formula (I):

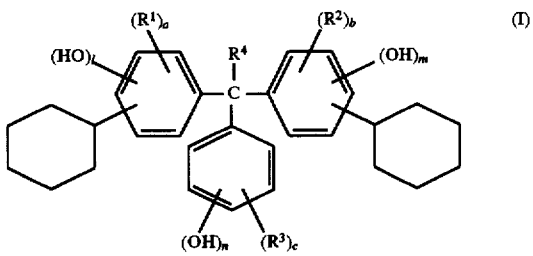

where $R^1$, $R^2$ and $R^3$ are each independently a hydrogen atom, an alkyl group having 1–3 carbon atoms or an alkoxy group having 1–3 carbon atoms; $R^4$ is a hydrogen atom or an alkyl group having 1–3 carbon atoms; a, b and c are an integer of 1–3; l, m and n are an integer of 1–3, in which at least part of the hydroxyl groups present are esterified with a quinonediazidosulfonic acid and a sulfonic acid which has a group represented by the following formula (II):

$$-SO_2-R^5 \quad (II)$$

where $R^5$ is a substituted or unsubstituted alkyl group, an alkenyl group or a substituted or unsubstituted aryl group, thereby forming a mixed ester.

According to another aspect, the invention relates to a multilayer resist material comprising a substrate overlaid with an antireflective coating which, in turn, is overlaid with a positive photoresist layer, said positive photoresist layer being formed of a positive photoresist composition comprising:

(A) an alkali-soluble resin; and (B) a light-sensitive component comprising at least one phenolic compound represented by said general formula (I), where $R^1$, $R^2$, $R^3$, $R^4$, a, b, c, l, m and n are each as defined above, in which at least part of the hydroxyl groups present are esterified with a quinonediazidosulfonic acid and a sulfonic acid which has a group represented by said general formula (II) where $R^5$ is as defined above, thereby forming a mixed ester.

DETAILED DESCRIPTION OF THE INVENTION

The alkali-soluble resin to be used as component (A) in the invention is not limited to any particular types and may be selected from among those which are commonly used as film-forming materials in positive photoresist compositions. Preferred examples include the products of poly-condensation reaction between aromatic hydroxy compounds and aldehydes or ketones, as well as polyhydroxystyrenes and derivatives thereof.

Exemplary aromatic hydroxy compounds include: phenol, m-cresol, p-cresol, o-cresol,xylenols such as 2,3-xylenol, 2,5-xylenol, 3,5-xylenol and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol and 2-tert-butyl-5-methylphenol; alkoxyphenols such as p-methoxyphenol, m-methoxyphenol, p-ethoxyphenol, m-ethoxyphenol, p-propoxyphenol and m-propoxyphenol; isopropenylphenols such as o-isopropenylphenol, p-isopropenylphenol, 2-methyl-4-isopropenylphenol and 2-ethyl-4-isopropenylphenol; arylphenols such as phenylphenol; and polyhydroxyphenols such as 4,4'-dihydroxybiphenyl, bisphenol A, resorcinol, hydroquinone and pyrogallol. These aromatic hydroxy compounds may be used either alone or in admixture. Among these aromatic hydroxy compounds, m-cresol, p-cresol, 2,5-xylenol, 3,5-xylenol and 2,3,5-trimethylphenol are particularly preferred.

Exemplary aldehydes include formaldehyde, paraformaldehyde, trioxane, acetaldehyde, propionaldehyde, butylaldehyde, trimethylacetaldehyde, acrolein, crotonaldehyde, cyclohexanealdehyde, furrural, furylacrolein, benzaldehyde, terephthaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde and cinnamic aldehyde. These aldehydes may be used either alone or in admixture. Among these aldehydes, formaldehyde is preferred because of its easy availability. For the particular purpose of providing improved heat resistance, formaldehyde is preferably used in combination with hydroxybenzaldehydes.

Exemplary ketones include acetone, methyl ethyl ketone, diethyl ketone and diphenyl ketone. These ketones may be used either alone or in admixture.

A particularly preferred combination of aromatic hydroxy compounds and ketones is that of pyrogallol and acetone.

The products of poly-condensation reaction between aromatic hydroxy compounds and aldehydes or ketones can be prepared by known procedures in the presence of acidic catalysts. Examples of acidic catalysts that may be used include hydrochloric acid, sulfuric acid, formic acid, oxalic acid and paratoluenesulfonic acid. The resulting polycondensation products are preferably fractionated or otherwise treated to cut off the low-molecular weight region because this will provide better heat resistance. Fractionation and other treatments may typically be carried out by dissolving the resin as the poly-condensation reaction product in good solvents such as alcohols (e.g. methanol and ethanol), ketones(e.g. acetone and methyl ethyl ketone), ethylene glycol monoethyl ether acetate and tetrahydrofuran, and then pouring the solution into water to form a precipitate.

The condensation reaction products thus obtained have the low-molecular weight region cut off and their weight average molecular weight ranges from 2,000 to 25,000, preferably from 2,500 to 20,000. The weight average molecular weight is calculated for polystyrene by gel permeation chromatography(GPC).

Exemplary polyhydroxystyrenes and derivatives thereof include homopolymers of vinylphenol and copolymers of vinylphenol with copolymerizable comonomers. Exemplary comonomers include acrylic acid derivatives, acrylonitrile, methacrylic acid derivatives, methacrylonitrile, styrene, and styrene derivatives such as α-methylstyrene, p-methylstyrene, o-methylstyrene, p-methoxystyrene and p-chlorostyrene.

The mixed ester as component (B) is such that at least part of the hydroxyl groups present in the phenolic compound represented by the general formula(I), where $R^1$, $R^2$, $R^3$, $R^4$, a, b, c, l, m and n are each as defined above, are esterified with a quinonediazidosulfonic acid and a sulfonic acid having a group represented by the general formula(II), where $R^5$ is as defined above. This mixed ester servos as the light-sensitive component of the positive photoresist composition of the invention.

The phenolic compounds represented by the general formula (I) can easily be prepared by a known procedure of condensing phenols having a cyclohexyl group with hydroxybenzaldehydes in the presence of acidic catalysts. Preferred examples of the compounds represented by the general formula(I) are those in which $R^1$ and $R^2$ are each a methyl group and $R^3$ and $R^4$ are each a hydrogen atom, as represented by the following general formula(IV):

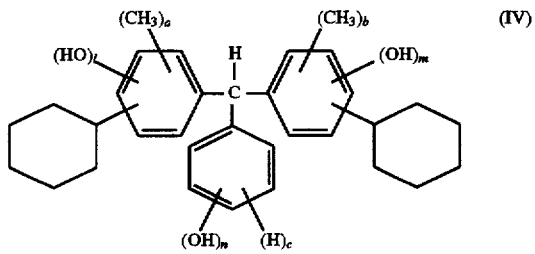

where a, b and c, as well as l, m and n are as defined above.

Among the compounds (IV), those in which a, b, l and m are each unity and n is 2, as represented by the following general formula (V), are particularly preferred:

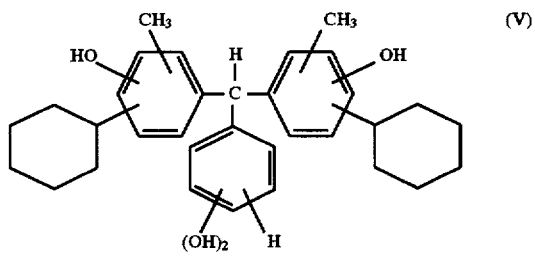

Most preferred are bis(5-cyclohexyl-4-hydroxy-2-methylphenyl)-3,4-dihydroxyphenylmethane and bis(5-cyclohexyl-2-hydroxy-4-methylphenyl)-3,4-dihydroxyphenylmethane because the number and positions of hydroxyl groups and the position of the cyclohexyl ring are such as to yield positive photoresists having high resolution and contrast.

When preparing the mixed ester by esterifying at least part of the hydroxyl groups in the formula(I), both a quinonediazidosulfonic acid and a sulfonic acid having the group represented by the general formula (II) are used. Exemplary quinonediazidosulfonic acids include naphthoquinone-1,2-diazido-5-sulfonic acid, naphthoquinone-1,2-diazido-4-sulfonic acid, naphthoquinone-1,2-diazido-6-sulfonic acid, orthobenzoquinonediazidosulfonic acid and orthoanthraquinonediazidosulfonic acid.

Quinonediazidosulfonic acid esters can be prepared by condensing the phenolic compounds (I) with quinonediazidosulfonyl chlorides in accordance with conventional procedures for preparing the light-sensitive component of positive photoresists. Stated specifically, the phenolic compounds of the general formula (I) and naphthoquinone-1,2-diazido-4(or 5)-sulfonyl chloride are dissolved in specified amounts in organic solvents such as dioxane, N-methylpyrrolidone, dimethylacetamide and tetrahydrofurane and reaction is performed in the presence of added basic catalysts such as triethanolamine, pyridine, alkali carbonates and alkali hydrogencarbonates and the resulting reaction products are washed with water and dried.

The ester with the sulfonic acid having the group of the general formula(II) can be prepared by condensing the phenolic compounds (I) with sulfonyl halides in the same manner as described above. Specific examples of the sulfonyl chlorides include: alkanesulfonyl halides having 1–12 carbon atoms such as methanesulfonyl chloride, methanesulfonyl fluoride, ethanesulfonylchloride, n-propanesulfonyl chloride, n-butanesulfonyl chloride, pentanesulfonyl chloride and dodecanesulfonyl chloride; substituted alkanesulfonyl halides having or 2 carbon atoms such as chloromethylsulfonyl chloride, dichloromethylsulfonyl chloride, trichloromethylsulfonyl chloride and 2-chloroethylsulfonyl chloride; alkenesulfonyl chlorides having 2 or 3 carbon atoms such as ethylenesulfonyl chloride and 1-propene-1-sulfonyl chloride; arylsulfonyl halides such as benzenesulfonyl chloride, benzensulfonyl fluoride and 1-naphthalenesulfonyl chloride; and alkyl-, alkenyl- and alkoxy-substituted arlysulfonyl halides such as p-toluenesulfonyl chloride, p-ethylbenzenesulfonyl chloride, p-styrenesulfonyl chloride and p-methoxybenzenesulfonyl chloride.

Among these, alkanesulfonyl halides, acrylsulfonyl halides and alkyl-substituted arylsulfonyl halides are preferred since they have a good balance between the cross-sectional profile, the margin of exposure and the depth of focus. Methanesulfonyl chloride, benzensulfonyl chloride, 1-naphthalenesulfonyl chloride and p-toluenesulfonyl chloride are particularly preferred. The sulfonyl halides listed above may be used either alone or in admixture.

The mixed ester as component (B) may be prepared by one of the following three methods: the phenolic compound (I) is first esterified with a quinonediazidosulfonic acid and, then, in order to introduce the group (II), the ester is reacted with an appropriate sulfonyl halide, thereby yielding the intended mixed ester (this procedure may be designated as method A); conversely, the phenolic compound (I) is reacted with a sulfonyl halide to introduce the group (II) and the resulting ester is reacted with a quinonediazidosulfonyl halide to yield the intended mixed ester (method B); alternatively, the phenolic compound (I) is reacted simultaneously with a quinonediazidosulfonyl halide and a sulfonyl halide which introduces the group (II), thereby yielding the intended mixed ester (method C). Among the three methods, C is used with particular advantage for the primary reason that the patterns to be eventually formed have better cross-sectional profiles.

The average degree of esterification in the mixed ester as component (B) is expressed by the number of moles of the quinonediazidosulfonic acid or the sulfonyl halide to introduce the group (II) which are used, as relative to the total number of moles of hydroxyl groups in the phenolic compounds (I). Stated specifically for the case where the phenolic compound (I) contains hydroxyl groups in a total of 4 moles, the quinonediazidosulfonic acid is used in an amount of 1.0–3.0 moles, preferable 1.6–2.4 moles (equivalent to 25–75%, preferably 40–60% as the average degree of esterification) whereas the sulfonyl halide for introducing the group (II) is used in an amount of 0.2–2.0 moles, preferably 0.3–1.0 mole(equivalent to 5.0–50%, preferably 7.5–25% as the average degree of esterfication). Using the mixed ester prepared within these ranges, one can reduce the deterioration in sensitivity and achieve greater improvements in the cross-sectional profile, the margin of exposure, resolution and the depth of focus.

In the present invention, component (B) may be used in combination with another light-sensitive material selected from conventional examples such as compounds containing a quinonediazido group. Exemplary compounds containing a quinonediazido group include naphthoquinone-1,2-diazidosulfonate esters and any compounds may be selected from commonly used light-sensitive esters without particular limitation. Preferred examples are esters of hydroxy compounds with halides of naphthoquinone-1,2-diazidosulfonic acids such as naphthoquinone-1,2-diazido-5-sulfonylic acid, naphthoquinone-1,2-diazido-4-sulfonic acid and naphthoquinone-1,2-diazido-6-sulfonic acid.

Examples of the ester forming hydroxy compounds include those listed below under (i)–(iv).

(i) Polyhydroxybenzophenones

Compounds of this class include 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydoxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxy benzophenone and 2,3,3',4,4',5'-hexahydroxybenzophenone.

(ii) Hydroxyaryl compounds represented by the following general formula (VI)

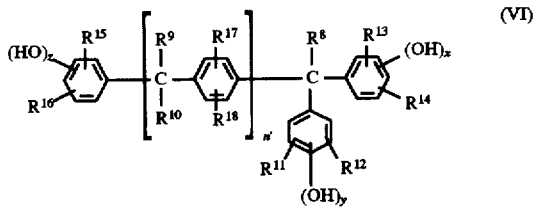

(wherein $R^8$–$R^{10}$ are each independently a hydrogen atom or an alkyl group having 1–4 carbon atoms; $R^{11}$–$R^{16}$ are each independently a hydrogen atom, a halogen atom, an alkyl group having 1–4 carbon atoms, an alkoxy group having 1–4 carbon atoms, an alkenyl group having 2–4 carbon atoms or cycloalkyl; $R^{17}$–$R^{18}$ are each independently a hydrogen atom or an alkyl group having 1–4 carbon atoms; x, y and z are each an integer of 1–3; and n' is 0 or 1):

Compounds of this class include tris(4-hydroxyphenyl) methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydoxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenyl-methane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxy-phenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl) isopropyl]-4-[1,1-bis(4-hydroxyphenyl)ethyl]-benzene and 1-[1-(3-methyl-4-hydorxyphenyl)isopropyl]-4-[1,1-bis(3-methyl-4-hydroxyphenyl)ethyl]benzene.

(iii) Bis(hydroxyphenyl)alkanes represented by the following general formula (III)

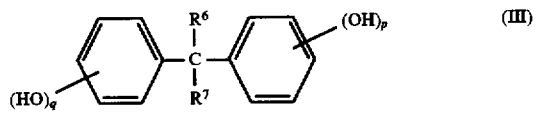

(wherein $R^6$ and $R^7$ are each independently a hydrogen atom or an alkyl group having 1–4 carbon atoms; and p and q are each an integer of 1–3):

Compounds of this class include 2-(2,3,4-trihydroxyphenyl)-2-(2',3',4'-trihydroxyphenyl)propane, 2-(2,4-dihydroxyphenyl)-2-(2',4'-dihydoxyphenyl)propane, 2-(4-hydroxyphenyl)-2-(4'-hydroxyphenyl)propane, bis(2,3,4-trihydroxyphenyl)methane and bis(2,4-dihydroxyphenyl) methane.

(iv) Hydroxy aromatic compounds

Compounds of this class include phenol, p-methoxyphenol, dimethylphenol, hydroquinone, bisphenol A, naphthol, pyrocatechol, pyrogallol monomethyl ether, pyrogallol-1,3-dimethyl ether, gallic acid, as well as partially esterified or etherized gallic acid.

The above-listed esters (i.e., compounds containing a quinonediazido group) which are usable as the light-sensitive component in combination with component (B) can be prepared by subjecting the naphthoquinone-1,2-diazidosulfonyl halides which are already described above and the hydroxy compounds (i)–(iv) to a condensation reaction to effect complete or partial esterification. The condensation reaction is typically performed with advantage in organic solvents such as dioxane, N-methylpyrrolidone and dimethylacetamide in the presence of basic condensing agents such as triethanolamine, alkali carbonates and alkali hydrogencarbonates.

Preferably, the hydroxy compounds are condensed with naphthoquinone-1,2-diazido-4(or 5)-sulfonyl halides in moles corresponding to at least 50%, preferably at least 60%, of the total number of moles of the hydroxyl groups in the hydroxy compound, thereby yielding esters with the average degree of esterification being at least 50%, preferably at least 60%. The use of such esters contributes high resolution.

Among the optional light-sensitive materials listed above, bis(hydroxyphenyl)alkanes of the general formula (III) as esterified with naphthoquinone-1,2-diazidosulfonic acids are particularly preferred. Such esterified products are incorporated with advantage in amounts ranging from 10 to 35 wt % of components (B).

The composition of the invention may contain a sensitizer as required to such an extent that it will not impair the preferred performance of the composition. A suitable sensitizer may be selected from among hydroxyaryl compounds of the general formula (VI) set forth above, or hydroxyaryl compounds represented by the following general formula (VII):

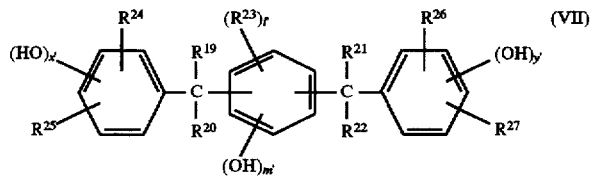

where $R^{19}$–$R^{22}$ are each independently a hydrogen atom or an alkyl group having 1–4 carbon atoms; $R^{23}$–$R^{27}$ are each independently a hydrogen atom, a halogen atom, or an alkyl or alkoxy group having 1–4 carbon atoms; l' is an integer of 1–3; and m', x' and y' are each an integer of 1–3.

Among the hydroxyaryl compounds of the formula (VI) exemplified hereinabove, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]-benzene and 1-[1-(3-methyl-4-hydroxyphenyl)isopropyl]-4-[1,1-bis(3-methyl-4-hydroxyphenyl)ethyl]benzene are preferred.

Preferred examples of the hydroxyaryl compounds of the formula(VII) include 2,6-bis[1-(2,4-dihydroxyphenyl)isopropyl]-4-methylphenol, 4,6-bis[1-(4-hydorxyphenyl)isopropyl]-resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol and 2,6-bis(2,3,4-trihydroxyphenylmethyl)-4-methylphenol.

If these hydroxyaryl compounds are to be incorporated in the composition of the invention, their content is selected from the range of 5–50 wt %, preferably 10–35 wt %, of the alkali-soluble resin which is component (A) of the present composition.

The total content of component (B) and the light-sensitive material which is optionally used in combination with (B) is preferably selected form the range of 15–40 wt %, desirably 20–30 wt %, of the total content of component (A) (alkali-soluble resin) and the optionally added hydroxyaryl compound (sensitizer, see above). If the content of component (B) is smaller than the lower limit, images of good pattern fidelity cannot be produced and only low transferability is achieved. If the content of component (B) is greater than the upper limit, deteriorated sensitivity and the reduced homogeneity of the resist films to be formed will combine to cause lower resolutions.

Depending on the need, the composition of the invention may further contain compatible additives such as anti-halation UV absorbers and anti-striation surfactants to such an extent that they will not be deleterious to the objects of the invention. Exemplary UV absorbers include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole,4-dimethylamino -4'-hydroxyazobenzene, 4-diethylamino-4'-ethoxyazonbenzene, 4-diethylaminoazobenzene and curcumin. Exemplary surfactants include fluorine-containing surfactants such as Furolard FC-430 and FC431 (tradenames of Sumitomo 3M, Ltd.) and F Top EF122A, EF122B, EF122C and EF126 (tradenames of Tohchem Products Co.)

The composition of the invention is preferably used in the form of a solution that is prepared by dissolving the alkali-soluble resin as component (A), the mixed ester as component (B) and any optional additive components in suitable solvents.

Exemplary solvents include: ketones such as acetone, methyl ethyl ketone, cyclohexanone, methyl isoamyl ketone and 2-heptanone; polyhydric alcohols such as ethylene glycol, propylene glycol, diethylene glycol, ethylene glycol monoacetate, propylene glycol monoacetate and diethylene glycol monoacetate, and derivatives thereof in ether forms such as monomethyl ether, monoethyl ether, monopropyl ether, monobutyl ether and monophenyl ether; cyclic ethers such as dioxane; and esters such as ethyl lactate, methyl acetate, ethyl acetate, butyl acetate, methyl pyruvate, ethyl pyruvate, methyl methoxypropionate and ethyl ethoxypropionate. These solvents may be used either alone or in admixture.

An example of the preferred method of using the composition of the invention proceeds as follows. A substrate such as a silicon wafer is spun or otherwise coated with a solution having the alkali-soluble resin (A), mixed ester (B) and any optional additives dissolved in a suitable solvent (see above) and the applied solution is dried to form a light-sensitive layer, which is then exposed via a desired mask pattern either to a uv light source (e.g. a low-pressure mercury lamp, a high-pressure mercury lamp, an ultra-high pressure mercury lamp, an are lamp or a xenon lamp) or to a scanning electron beam. The substrate is then immersed in a weak alkaline, aqueous developing solution such as an aqueous solution of 1–10 wt % tetramethylammonium hydroxide (TMAH), whereupon the exposed areas are dissolved away to produce an image having high fidelity to the mask pattern.

The multilayer resist material according to the second aspect of the invention comprises a substrate that is overlaid with an anti-reflective coating which, in turn, is overlaid with the positive photoresist layer formed by application of the composition of the invention. The compounds to form the anti-reflective coating are not limited in any particular way and conventionally known compounds may be used. Advantageous examples include triazine compounds that contain either a thermally crosslinkable methylol or alkoxy group or both and which have UV absorbers added thereto, optionally in combination with alkali-insoluble acrylic resins. Such compounds to form the anti-reflective coating are then dissolved in organic solvents for application to the substrate.

Exemplary triazine compounds that contain either a thermally crosslinkable methylol or alkoxy group or both include melamine and guanamine that contain either a methylol group or an alkoxymethyl group (e.g. methoxymethyl, ethoxymethyl, propoxymethyl or butoxymethyl) or both groups.

Such triazine compounds can easily be prepared by known procedures. In one instance, melamine or guanamine is methylated by reaction with formaldehyde in boiling water, optionally followed by reaction with a lower alcohol to effect alkoxylation. Methoxymethylated triazine compounds are commercially available from Sanwa Chemical Co., Ltd. under the tradenames Mx-750 (melamine having 3.7 methoxymethyl groups on average) and Mw-30 (melamine having 5.8 methoxymethyl groups on average).

Exemplary UV absorbers include 2,2',4,4'-tetrahydroxybenzophenone and curcumin.

Preferred alkali-insoluble acrylic resins are those polymers which are prepared from starting monomers including alkyl (meth)acrylates such as methyl (meth)acrylate, ethyl (meth)acrylate and propyl (meth)acrylate, and glycidyl (meth)acrylate and which have weight average molecular weights in the range of 10,000–200,000, preferably in the range of 20,000–100,000. Particularly preferred are copolymers of glycidyl methacrylate and methyl methacrylate in weight ratios of 2:8–8:2.

The anti-reflective coating is formed by dissolving the above-mentioned components in a suitable organic solvent, applying the resulting solution onto a substrate, drying the applied coating, and baking it at a temperature of 100°–300° C.

The organic solvent in which the respective components of the anti-reflective coating are to be dissolved may be of the same types as the organic solvents used to prepare the positive photoresist composition of the invention.

Exemplary substrates that can be used include silicon wafers that may optionally be provided with highly reflective films formed of aluminum or tungsten silicide.

The multilayer resist material according to the second aspect of the invention comprises the substrate that is overlaid with the anti-reflective coating which, in turn, is overlaid with the positive photoresist layer formed from the composition of the invention. For patterning of the positive photoresist layer, exposure and development steps are performed in the manner already described above. With the resulting resist layer used as a mask, the anti-reflective coating is patterned by dry etching with Cl gas or other etchant. In order to prevent unwanted loss in the thickness of the resist layer during dry etching, it may be subjected to a known silylation process.

The following examples are provided for the purpose of further illustrating the present invention but are in no way to be taken as limiting.

EXAMPLES

In the examples that follow, positive photoresist compositions were evaluated for their performance by the following methods.

Margin of exposure

A sample was spin coated onto a silicon wafer and dried on a hot plate at 90° C. for 90 seconds to form a resist film 1.05 μm thick. The film was exposed on a reduction projection printer NSR-2005i10D(NIKON Corp.; NA=0.54) for a length of time that was increased from 0.1 second at 0.01-sec intervals. Thereafter, the wafer was subjected to PEB (post-exposure bake) at 110° C. for 90 seconds, developed in an aqueous solution of 2.38 wt % tetramethylammonium hydroxide at 23° C. for 65 seconds, washed with water for 30 seconds and dried. When the minimal exposure time necessary to perform the intended patterning was written as Eth (Ethreshold in ms) and the exposure time necessary to produce 0.4-μm wide lines and spacings at a ratio of 1:1 was written as Eop (Eoptimum in ms), the margin of exposure was calculated as Eop/Eth.

Cross-sectional profile

The cross-sectional profile of resist patterns formed in a width of 0.40 μm was examined by taking pictures with SEM (scanning electron microscope) and evaluated by the following criteria: A, the profile was rectangular; A', the profile had a slight undercut at the interface with the substrate but remained substantially rectangular; B, the profile had considerable undercut at the interface with the substrate; C, the profile was tapered.

Depth of focus 1

With Eop (the amount of exposure necessary to produce a line-to-spacing ratio of 1:1 for a width of 0.40 μm) being used as a reference, exposure was performed on a reduction projection printer NSR-2005i10D(NIKON Corp.; NA=0.54) under slightly defocused conditions. After development, the resulting resist patterns were examined by SEM microscopy. A maximum value (μm) of defocusing that allowed a rectangular resist pattern to form in a width of 0.40 μm was designated as depth of focus 1.

Depth of focus 2

The same procedure as just described above was repeated, except that Eop was the amount of exposure necessary to produce a line-to spacing ratio of 1:1 for a width of 0.35 μm. A maximum value (μm) of defocusing that allowed a rectangular resist pattern to form in a width of 0.35 μm was designated as depth of focus 2.

Depth of focus 3

The same procedure as described above was repeated, except that Eop was the amount of exposure necessary to produce a line-to-spacing ratio of 1:1 in a thickness of 0.32 μm. A maximum value(μm) of defocusing that allowed a rectangular resist pattern to form in a width of 0.32 μm was designated as depth of focus 3.

PREPARATION EXAMPLE 1

Bis(5-cyclohexyl-4-hydroxy-2-methylphenyl)-3,4-dihydroxyphenylmethane(1.0 mole), naphthoquinone-1,2-diazido-5-sulfonyl chloride (2.0 moles) and methanesulfonyl chloride(0.5 moles) were dissolved in dioxane (4,000 g). To the resulting solution, dioxane (1,500 g) having triethylamine (500 g) dissolved therein was added dropwise over 40 minutes at a controlled temperature not higher than 35° C. The precipitating salt was separated by filtration and the thus recovered reaction product was washed and dried to yield a mixed ester of bis(5-cyclohexyl-4-hydroxy-2-methylphenyl)-3,4-dihydroxyphenylmethane with naphthoquinone-1,2-diazido-5-sulfonic acid and methanesulfonic acid; the average degree of esterification was 50% for the quinonediazidosulfonate ester and 12% for the methanesulfonate ester.

PREPARATION EXAMPLE 2

A mixed ester was prepared as in Preparation in Example 1, except that 0.5 moles of the methanesulfonyl chloride was replaced by 0.5 moles of benzenesulfonyl chloride. The average degree of esterification was the same as in Preparation Example 1 for both the quinonediazidosulfonate ester and the benzenesulfonate ester.

PREPARATION EXAMPLE 3

A mixed ester was prepared as in Preparation in Example 1, except that 0.5 moles of the methanesulfonyl chloride was replaced by 0.5 moles of p-toluenesulfonyl chloride. The average degree of esterification was the same as in Preparation Example 1 for both the quinonediazidosulfonate ester and the p-toluenesulfonate ester.

PREPARATION EXAMPLE 4

A mixed ester was prepared as in Preparation in Example 1, except that 0.5 moles of the methanesulfonyl chloride was replaced by 0.5 moles of 1-naphthalenesulfonyl chloride. The average degree of esterification was the same as in Preparation Example 1 for both the quinonediazidosulfonate ester and the 1-naphthalenesulfonate ester.

PREPARATION EXAMPLE 5

Bis(5-cyclohexyl-4-hydroxy-2-methylphenyl)-3,4-dihydroxyphenylmethane (1.0 mole) and naphthoquinone-1,2-diazido-5-sulfonyl chloride (2.0 moles) were dissolved in dioxane (4,000 g). To the resulting solution, dioxane (1,500 g) having triethylamine (500 g) dissolved therein was added dropwise over 40 minutes at a controlled temperature not higher than 35° C. The precipitating salt was separated by filtration and the thus recovered reaction product was washed and dried to yield an ester of bis (5-cyclohexyl-4-hydroxy-2-methylphenyl)-3,4-dihydroxyphenylmethane with naphthoquinone-1,2-diazido-5-sulfonic acid.

The thus obtained naphthoquinone-1,2-diazido-5-sulfonate ester (1 mole) and methanesulfonyl chloride (0.5 moles) were dissolved in dioxane (10 kg). To the resulting solution, dioxane (250 g) having triethylamine (60 g) dissolved therein was added dropwise over 10 minutes at a controlled temperature not higher than 30° C. The precipitating salt was separated by filtration and the thus recovered reaction product was washed and dried to yield a mixed ester of bis(5-cyclohexyl-4-hydroxy-2-methylphenyl)-3,4-dihydroxyphenylmethane with naphthoquinone-1,2-diazido-5-sulfonic acid and methanesulfonic acid; the average degree of esterification was the same as in Preparation Example 1 for both the quinonediazidosulfonate ester and the methanesulfonate ester.

COMPARATIVE PREPARATION EXAMPLE 1

Bis(5-cyclohexyl-4-hydroxy-2-mehylphenyl)-3,4-dihydroxyphenylmethane (1.0 mole) and naphthoquinone-1,2-diazido-5-sulfonyl chloride (2.0 moles) were dissolved in dioxane (4,000 g). To the resulting solution, dioxane (2,000 g) having triethylamine (500 g) dissolved therein was added dropwise over 40 minutes at a controlled temperature not higher than 35° C. The precipitating salt was separated by filtration and the thus recovered reaction product was washed and dried to yield an ester of the bis(5-cyclohexyl-4-hydroxy-2-methylphenyl)-3,4-dihydroxyphenylmethane with naphthoquinone-1,2-diazido-5-sulfonic acid.

COMPARATIVE PREPARATION EXAMPLE 2

One (1.0) mole of 1-[1-(4-hydroxyphenyl)isopropyl]-4-[1,1-bis(4-hydroxyphenyl)ethyl]benzene, naphthoquinone-1,2-diazido-5-sulfonyl chloride (2.0 moles) and methanesulfonyl chloride (0.5 moles) were dissolved in dioxane (4,000 g). To the resulting solution, dioxane (2,000 g) having triethylamine (500 g) dissolved therein was added dropwise over 10 minutes at a controlled temperature not higher than 30° C. The precipitating salt was separated by filtration and the thus recovered reaction product was washed and dried to yield esters of the 1-[1-(4-hydroxyphenyl)isopropyl]-4-[1,1-bis(4-hydroxyphenyl)ethyl]benzene with naphthoquinone-1,2-diazido-5-sulfonic acid and methanesulfonic acid.

EXAMPLE 1

A 40:60 (by wt.) mixture of m- and p-cresol was subjected to polycondensation with formaldehyde in the usual manner using an oxalic acid catalyst. The resulting cresol novolac resin was fractionated to cut off a low-molecular weight region, thereby yielding a weight average molecular weight of 4,000. The thus obtained cresol novolac resin (100 parts by weight), bis(4-hydroxy-3,5-dimethylphenyl)-2-hydroxyphenylmethane (25 parts by weight) and the mixed ester obtained in Preparation Example 1 (to be used as a light-sensitive component; 35 parts by weight) were dissolved in a mixed solvent system consisting of ethyl tactate (432 parts by weight) and butyl acetate (48 parts by weight ). The resulting solution was passed through a membrane filter having a pore size of 0.2 µm, thereby producing a positive photoresist composition.

The photoresist composition was evaluated for the margin of exposure, the cross-sectional profile and the depths of focus 1, 2 and 3. The results are shown in Table 1 below.

EXAMPLES 2-5 AND COMPARATIVE EXAMPLES 1 AND 2

Positive photoresist compositions were produced by repeating the procedure of Example 1, except that the light-sensitive component was replaced by those prepared in Preparation Examples 2-5 and Comparative Preparation Examples 1 and 2, respectively.

The compositions thus produced were evaluated for the margin of exposure, the cross-sectional profile and the depths of focus 1, 2 and 3. The results are also shown in Table 1.

TABLE 1

| Run No. | Source of light-sensitive component | Margin of exposure | Cross-sectional profile | Depth of focus | | |
|---|---|---|---|---|---|---|
| | | | | 1 | 2 | 3 |
| Example 1 | Preparation Example 1 | 2.0 | A' | 1.6 | 1.2 | 0.6 |
| Example 2 | Preparation Example 2 | 2.0 | A | 1.6 | 1.2 | 0.4 |
| Example 3 | Preparation Example 3 | 2.0 | A' | 1.6 | 1.0 | 0.4 |
| Example 4 | Preparation Example 4 | 2.0 | A | 1.2 | 0.8 | N.A. |
| Example 5 | Preparation Example 5 | 2.0 | A' | 1.4 | 1.0 | 0.4 |
| Comparative Example 1 | Comparative Preparation Example 1 | 1.8 | B | 1.4 | 0.6 | N.A. |
| Comparative Example 2 | Comparative Preparation Example 2 | 2.0 | C | 1.2 | 0.8 | N.A. |

N.A. stands for "not available".

EXAMPLE 6

Mx-750(the trade name of Sanwa Chemical Co., Ltd. for melamine having 3.7 methoxymethyl groups on average), 2,2',4,4'-tetrahydroxybenzophenone and a copolymer of glycidyl methacrylate and methyl methacrylate were dissolved in propylene glycol monomethyl ether acetate. The thus prepared coating solution was applied onto a silicon wafer, dried, then baked at 180° C. to form an anti-reflective coating.

Subsequently, m- and p- cresol were mixed at a weight ratio of 40:60. The mixture was subjected to polycondensation with formaldehyde in the usual manner using an oxalic acid catalyst. The resulting cresol novolac resin was fractionated to cut off a low-molecular weight region, thereby yielding a weight average molecular weight of 4,000. The thus obtained cresol novolac resin (100 parts by weight), bis(4-hydroxy-3,5-dimethylphenyl)-2-hydroxyphenylmethane (25 parts by weight) and the mixed ester obtained in Preparation Example 3 (to be used as a light-sensitive component; 35 parts by weight) were dissolved in a mixed solvent system consisting of ethyl tactate (432 parts by weight) and butyl acetate (48 parts by weight). The resulting solution was passed through a membrane filter having a pore size of 0.2 µm, thereby producing a positive photoresist composition.

The positive photoresist composition was spin coated to form a positive resist layer on the anti-reflective coating, thereby producing a multilayer resist material. This material was evaluated for the margin of exposure, the cross-sectional profile and depths of focus 1', 2' and 3' with respect to the positive photoresist layer by the following methods. The results of evaluation are shown in Table 2 below.

Margin of exposure

A sample of multilayer resist material carrying the above-described anti-reflective coating and a positive photoresist layer 0.85 μm thick was exposed on a reduction projection printer NSR-2005i10D (NIKON Corp.; NA=0.57) for a length of time that was increased from 0.1 second at 0.01-sec intervals. Thereafter, the sample was subjected to PEB (post-exposure bake) at 110° C. for 90 seconds, developed in an aqueous solution of 2.38 wt % tetramethylammonium hydroxide at 23° C. for 65 seconds, washed with water or 30 seconds and dried. When the minimal exposure time necessary to perform the intended patterning was written as Eth (Ethreshold in ms) and the exposure time necessary to produce 0.35-μm wide lines and spacing at a ratio of 1:1 was written as Eop(Eoptimum in ms), the margin of exposure was calculated as Eop/Eth.

Cross-sectional profile

The cross-sectional profile of resist patterns formed in a width of 0.35 μm was examined by taking pictures with SEM (scanning electron microscope) and evaluated by the following criteria: A, the profile was rectangular; A', the profile had a slight undercut at the interface with the substrate but remained substantially rectangular; B, the profile had considerable undercut at the interface with the substrate; C, the profile was tapered.

Death of focus 1'

With Eop (the amount of exposure necessary to produce a line-to-spacing ratio of 1:1 for a width of 0.35 μm) being used as a reference, exposure was performed on a reduction projection printer NSR-2005i10D (NIKON Corp.; NA=0.57) under slightly defocused conditions. After development, the resulting resist patterns were examined by SEM microscopy. A maximum value (μm) of defocusing that allowed a rectangular resist pattern to form in a width of 0.35 μm was designated as depth of focus 1'.

Depth of focus 2'

The same procedure as just described above was repeated, except that Eop was the amount of exposure necessary to produce a line-to-spacing ratio of 1:1 for a width of 0.32 μm. A maximum value(μm) of defocusing that allowed a rectangular resist pattern to form in a width of 0.32 μm was designated as depth of focus 2'.

Depth of focus 3'

The same procedure as described above was repeated, except that Eop was the amount of exposure necessary to produce a line-to-spacing ratio of 1:1 for a width of 0.30 μm. A maximum value (μm) of defocusing that allowed a rectangular resist pattern to form in a width of 0.30 μm was designated as depth of focus 3'.

COMPARATIVE EXAMPLE 3

A multilayer resist material was produced by repeating the procedure of Example 6, except that the anti-reflective coating was overlaid with a positive photoresist layer which was formed of a positive photoresist composition using the light-sensitive component obtained in Comparative Preparation Example 1. The positive photoresist layer in this material was evaluated for the margin of exposure, the cross-sectional profile and depths of focus 1', 2' and 3' by the same methods as employed in Example 6. The results are also shown in Table 2.

TABLE 2

| Run No. | Source of light-sensitive component | Margin of exposure | Cross-sectional profile | Depth of focus | | |
|---|---|---|---|---|---|---|
| | | | | 1' | 2' | 3' |
| Example 6 | Preparation Example 3 | 2.2 | A | 1.8 | 1.6 | 1.3 |
| Comparative Example 3 | Comparative Preparation Example 1 | 2.1 | C | 1.0 | 0.8 | 0.2 |

As described in detail on the foregoing pages, the positive photoresist composition according to the first aspect of the invention is capable of forming high-resolution resist patterns with good cross-sectional profiles and permits a wider margin of exposure and better depth-of-focus characteristics. This is also true with the multilayer resist material according to the second aspect of the invention and it is capable of forming high-resolution resist patterns with good cross-sectional profiles and permits a wider margin of exposure and better depth-of-focus characteristics.

What is claimed is:

1. A positive photoresist composition comprising:
   (A) an alkali-soluble resin; and
   (B) a light-sensitive component comprising at least one phenolic compound represented by the following general formula (I):

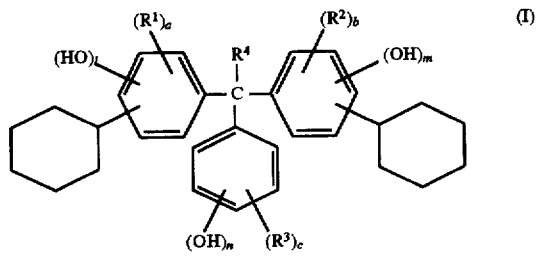

where $R^1$, $R^2$ and $R^3$, are each independently a hydrogen atom, an alkyl group having 1–3 carbon atoms or an alkoxy group having 1–3 carbon atoms; $R^4$ is a hydrogen atom or an alkyl group having 1–3 carbon atoms; a, b and c are an integer of 1–3; l, m and n are an integer of 1–3, in which at least part of the hydroxyl groups present are esterified with a quinonediazidsulfonic acid and a sulfonic acid which has a group represented by the following formula (II):

where $R^5$ is an alkyl group having 1–12 carbon atoms, a halogen-substituted alkyl group having 1 or 2 carbon atoms, an alkenyl group having 2 or 3 carbon atoms, an aryl group having 6–10 carbon atoms, or a methyl-, ethyl-, ethenyl- or methoxy-substituted aryl group having 7 or 8 carbon atoms, thereby forming a mixed ester.

2. A positive photoresist composition according to claim 1, wherein the group represented by the general formula (II) is at least one member selected from among a methylsulfonyl group, a phenylsulfonyl group and a p-toluenesulfony group.

3. A positive photoresist composition according to claim 1, wherein $R^1$ and $R^2$ in the general formula (I) representing the phenolic compound are each a methyl group and $R^3$ and $R^4$ are each a hydrogen atom.

4. A positive photoresist composition according to claim 1, wherein a, b, l and m in the general formula (I) representing the phenolic compound are each unity.

5. A positive photoresist composition according to claim 4, wherein $(OH)_n$ in the general formula (I) representing the phenolic compound is $(OH)_2$, and said hydroxyl groups are coordinated to the benzene ring in positions 3 and 4.

6. A positive photoresist composition according to claim 1, wherein the average degree of esterification in said component (B) with the quinonediazidosulfonic acid is 25–75% whereas the average degree of esterification with the sulfonic acid having the group represented by the general formula (II) is 5–25%.

7. A positive photoresist composition according to claim 1, which further contains a quinonediazidosulfonate ester of a bis(hydroxyphenyl)alkane represented by the following formula (III):

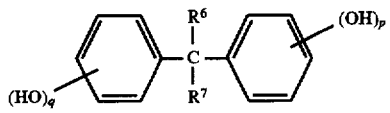

where $R^6$ and $R^7$ are each independently a hydrogen atom or an alkyl group having 1–4 carbon atoms; and p and q are each an integer of 1–3.

8. A positive photoresist composition according to claim 1, wherein the mixed ester as component (B) is prepared by first providing the quinonediazidosulfonate ester of the phenolic compound of the general formula (I) and then reacting said ester with a sulfonyl halide for introducing the group of the general formula (II).

9. A positive photoresist composition according to claim 1, wherein the mixed ester as component (B) is prepared by first reacting the phenolic compound of the general formula (I) with a sulfonyl halide for introducing the group of the general formula (II) so as to give a sulfonate ester of said phenolic compound and by then reacting said sulfonate ester with a quinonediazidosulfonyl halide.

10. A positive photoresist composition according to claim 1, wherein the mixed ester as component (B) is prepared by allowing the phenolic compound of the general formula (I) to react simultaneously with a quinonediazidosulfonyl halide and a sulfonyl halide for introducing the group of the general formula (II).

11. A positive photoresist composition according to claim 1, wherein the alkali-soluble resin as component (A) is the product of polycondensation reaction between an aromatic hydroxy compound and an aldehyde or a ketone.

12. A multilayer resist material comprising a substrate that is overlaid with an anti-reflective coating which, in turn, is overlaid with a positive photoresist layer, said positive photoresist layer being formed of the positive photoresist composition of claim 1.

* * * * *